United States Patent
Dasgupta et al.

(10) Patent No.: US 10,170,612 B2
(45) Date of Patent: Jan. 1, 2019

(54) EPITAXIAL BUFFER LAYERS FOR GROUP III-N TRANSISTORS ON SILICON SUBSTRATES

(71) Applicant: Intel Corporation, Santa Clara, CA (US)

(72) Inventors: Sansaptak Dasgupta, Santa Clara, CA (US); Han Wui Then, Portland, OR (US); Niloy Mukherjee, Beaverton, OR (US); Marko Radosavljevic, Beaverton, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/421,322

(22) Filed: Jan. 31, 2017

(65) Prior Publication Data

US 2017/0141219 A1    May 18, 2017

Related U.S. Application Data

(63) Continuation of application No. 13/631,514, filed on Sep. 28, 2012, now Pat. No. 9,583,574.

(51) Int. Cl.
  *H01L 29/778* (2006.01)
  *H01L 29/205* (2006.01)
  (Continued)

(52) U.S. Cl.
  CPC ........ *H01L 29/7787* (2013.01); *H01L 23/535* (2013.01); *H01L 29/04* (2013.01);
  (Continued)

(58) Field of Classification Search
  None
  See application file for complete search history.

(56) References Cited

U.S. PATENT DOCUMENTS

2002/0187356 A1   12/2002   Weeks, Jr. et al.
2004/0119063 A1    6/2004   Guo et al.
(Continued)

FOREIGN PATENT DOCUMENTS

EP         2166575 A1     3/2010
JP      2004-235473       8/2004
(Continued)

OTHER PUBLICATIONS

Notice of Allowance from the Examiner of the Intellectual Property Office dated Nov. 22, 2016 for Taiwan Patent Application No. 104127874 (2 pages).
(Continued)

*Primary Examiner* — Charles Garber
*Assistant Examiner* — Alia Sabur
(74) *Attorney, Agent, or Firm* — Schwabe, Williamson & Wyatt, P.C.

(57) ABSTRACT

Embodiments include epitaxial semiconductor stacks for reduced defect densities in III-N device layers grown over non-III-N substrates, such as silicon substrates. In embodiments, a metamorphic buffer includes an $Al_xIn_{1-x}N$ layer lattice matched to an overlying GaN device layers to reduce thermal mismatch induced defects. Such crystalline epitaxial semiconductor stacks may be device layers for HEMT or LED fabrication, for example. System on Chip (SoC) solutions integrating an RFIC with a PMIC using a transistor technology based on group III-nitrides (III-N) capable of achieving high $F_t$ and also sufficiently high breakdown voltage (BV) to implement high voltage and/or high power circuits may be provided on the semiconductor stacks in a first area of the silicon substrate while silicon-based CMOS circuitry is provided in a second area of the substrate.

30 Claims, 5 Drawing Sheets

(51) Int. Cl.
| | |
|---|---|
| H01L 29/66 | (2006.01) |
| H01L 29/423 | (2006.01) |
| H01L 23/535 | (2006.01) |
| H01L 29/04 | (2006.01) |
| H01L 29/20 | (2006.01) |

(52) U.S. Cl.
CPC ........ *H01L 29/205* (2013.01); *H01L 29/4236* (2013.01); *H01L 29/66431* (2013.01); *H01L 29/66462* (2013.01); *H01L 29/66545* (2013.01); *H01L 29/2003* (2013.01)

(56) References Cited

U.S. PATENT DOCUMENTS

| | | | |
|---|---|---|---|
| 2008/0128745 A1* | 6/2008 | Mastro | H01L 31/078 257/184 |
| 2009/0045438 A1 | 2/2009 | Inoue et al. | |
| 2009/0267078 A1 | 10/2009 | Mishra et al. | |
| 2009/0270137 A1 | 10/2009 | Sorensen et al. | |
| 2010/0012952 A1 | 1/2010 | Saxier et al. | |
| 2010/0072484 A1 | 3/2010 | Jimenez et al. | |
| 2010/0327322 A1* | 12/2010 | Kub | H01L 29/0847 257/194 |
| 2011/0046527 A1 | 2/2011 | Sandhu et al. | |
| 2011/0278644 A1* | 11/2011 | Gao | H01L 29/66462 257/190 |
| 2011/0297961 A1 | 12/2011 | Bunin et al. | |
| 2012/0098036 A1 | 4/2012 | Bahl et al. | |
| 2012/0153351 A1* | 6/2012 | Chandolu | H01L 29/2003 257/192 |
| 2013/0099245 A1 | 4/2013 | Ando et al. | |

FOREIGN PATENT DOCUMENTS

| | | |
|---|---|---|
| JP | 2007-258406 | 10/2004 |
| JP | 2007258406 A * | 10/2007 |
| KR | 10-2007-0088817 A | 8/2007 |

OTHER PUBLICATIONS

Communication of Extended European Search Report from the European Patent Office dated Apr. 20, 2016 for PCT/US2013/47624.

Ching-Hui Chen et al., "High-Transconductance Self-Aligned AlGaN/GaN Modulation-Doped Field-Effect Transistors with Regrown Ohmic Contacts", 1998 American Institute of Physics, Applied Physics Letter, vol. 73. Number 21, Nov. 23, 1998, pp. 3147-3149.

Tetsu Kachi et al., "GaN Power Device and Reliability for Automotive Applications", 2012 IEEE, pp. 3D.1.1-3D.1.4.

Office Action in Preliminary Examination and Search Report for Taiwan Patent Application No. 102133679 dated May 5, 2015 and English translation thereof.

Office Action including Search Report from the Taiwan Examiner of the Intellectual Property Office (the IPO) dated Jun. 15, 2016 for Taiwan Patent Application No. 104127874 and English Translation thereof.

Notice of Preliminary Rejection (Non-Final) from the Korean Intellectual Property Office (KIPO) dated Jun. 16, 2016 for Korean Patent Application No. 10-2015-7004533 and English Summary thereof.

First Office Action from the Chinese Patent Office dated Jul. 5, 2016 for Chinese Patent Application No. 201380045070.2 (10 pages).

International Search Report and Written Opinion dated Sep. 27, 2013 for PCT/US2013/047624 filed Jun. 20, 2013.

Office Action for European Application No. 13842575.6 dated Nov. 24, 2017, 5 pages.

Notice of Allowance for Korean Patent Application No. 10-2015-7004533 dated Aug. 21, 2017, 2 pages.

International Preliminary Report on Patentability for International Patent App. No. PCT/US2013/047624 dated Apr. 9, 2015, 8 pages.

Notice of Allowance for Taiwan Patent Application No. 102133679 dated Jul. 23, 2017, 2 pages.

Notice of Allowance for Taiwan Patent Application No. 105143033 dated Oct. 2, 2017, 2 pages.

Second Office Action dated Mar. 22, 2017 from the Chinese Patent Office for Chinese Patent Application No. 201380045070.2 (3 pages).

Notice of Second Preliminary Rejection (5 pages) dated Feb. 27, 2017 from the Korean Intellectual Property Office (KIPO) for Korean Patent Application No. 10-2015-7004533 and English Summary (1 page) thereof.

Tetsu Kachi et al., "GaN Power Device and Reliability for Automotive Applications" Japanese Science and Technology Agency (JST), CREST, Chiyoda, Tokyo 102-0075, Japan, IEEE 2012.

Notice of Allowance from the Chinese State Intellectual Property Office dated Jun. 1, 2017 for Chinese Patent Application No. 201380045070.2 (6 pages), and English Translation thereof (1 page).

Office Action for Korean Patent Application No. 10-2017-7032944, dated Aug. 31, 2018, 4 pages.

* cited by examiner

EPITAXIAL BUFFER LAYERS FOR GROUP III-N TRANSISTORS ON SILICON SUBSTRATES

This is a Continuation Application of application Ser. No. 13/631,514 filed Sep. 28, 2012 which is hereby incorporated by reference.

TECHNICAL FIELD

Embodiments of the present invention generally relate to microelectronic devices and manufacture, and more particularly to group III-N transistor architecture and design.

BACKGROUND

The mobile computing (e.g., smart phone and tablet) markets benefit from smaller component form factors and lower power consumption. Because current platform solutions for smart phones and tablets rely on multiple packaged integrated circuits (ICs) mounted onto a circuit board, further scaling to smaller and more power efficient form factors is limited. For example, a smart phone will include a separate power management IC (PMIC), radio frequency IC (RFIC), and WiFi/Bluetooth/GPS IC, in addition to a separate logic processor IC. System on Chip (SoC) architectures offer the advantage of scaling which cannot be matched by board-level component integration. While the logic processor IC may itself be considered a system on a chip (SoC) integrating both memory and logic functions, more extensive SoC solutions for mobile computing platforms have remained elusive because the PMIC and RFIC operate with two or more of high voltage, high power, and high frequency.

As such, conventional mobile computing platforms typically utilize incompatible transistor technologies that are specifically tailored for the different functions performed by the PMIC and RFIC. For example, laterally diffused silicon MOS (LDMOS) technology is typically employed in the PMIC to manage voltage conversion and power distribution (battery voltage regulation including step-up and/or step-down voltage conversion, etc.). Group III-V compound semiconductors, such a GaAs heterojunction bipolar transistors (HBTs), are typically utilized in the RFIC to generate sufficient power amplification at GHz carrier frequencies. Conventional silicon field effect transistors implementing CMOS technology then entail a third transistor technology utilized for logic and control functions within the mobile computing platform. In addition to fundamental semiconductor material incompatibilities between the various ICs in the mobile computing platform, transistor design for DC-to-DC conversion switches in the PMIC has been generally incompatible with the transistor design for high frequency power amplifiers in the RFIC. For example, the relatively low breakdown voltage of silicon requires source-to-drain separation in a DC-to-DC converter switch to be vastly larger than is permissible for a power amplifier transistor needing an $F_t$ exceeding 20 GHz, and possibly up to 500 GHz, depending on the carrier frequency (e.g., WPAN is 60 GHz and so transistors need an $F_t$ many times 60 GHz). Such different transistor-level design requirements render the fabrication processes for the various transistor designs distinct and difficult to integrate into a single process.

Therefore, while an SoC solution for the mobile computing space that would integrate PMIC and RFIC functions is attractive for improving scalability, lowering costs, and improving platform power efficiency, one barrier to an SoC solution is the lack of a scalable transistor technology having both sufficient speed (i.e., sufficiently high gain cutoff frequency, $F_t$), and sufficiently high breakdown voltage (BV).

Group III-nitride (III-N) devices offer a promising avenue for integration of PMIC and RFIC functions with CMOS as both high BV and $F_t$ can be obtained. However, heteroepitaxy of III-N material stacks on silicon substrates poses a technical challenge for at least the reasons of significant lattice mismatch and thermal mismatch, both of which can lead to high defect densities and poor device performance. Techniques and epitaxial semiconductor stack architectures which can provide reduced defect densities in device layers are therefore advantageous.

BRIEF DESCRIPTION OF THE DRAWINGS

Embodiments of the present invention are illustrated by way of example, and not by way of limitation, and can be more fully understood with reference to the following detailed description when considered in connection with the figures, in which.

DETAILED DESCRIPTION

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Described herein are embodiments of epitaxial semiconductor stacks for reduced defect densities in III-N device layers grown over non-III-N substrates, such as silicon substrates. In embodiments, a metamorphic buffer includes an $Al_xIn_{1-x}N$ layer lattice matched to overlying device layers, such as GaN, for reduced thermal mismatch induced defects in the device layers. Such crystalline epitaxial semiconductor stacks may be used to provide devices layers for HEMT or LED fabrication, for example. In embodiments, group III-nitride (III-N) semiconductor stacks and high electron mobility transistors formed thereon are employed in SoC solutions integrating an RFIC with a PMIC to implement high voltage and/or high power circuits. With epitaxial stack embodiments described herein, SoC solutions may deliver the product specific electrical current and power requirements needed for a mobile computing platform. The fast switching, high voltage transistors are capable of handling high input voltage swings and providing high power added efficiencies at RF frequencies. In embodiments, the III-N semiconductor stack and transistor architecture is amenable to monolithic integration with group IV transistor architectures, such as planar and non-planar silicon CMOS transistor technologies. In particular embodiments, group III-N transistors are employed in SoC architectures integrating high power wireless data transmission and/or high voltage power management functions with low power CMOS logic data processing. High frequency operation suitable for broadband wireless data transmission applications is possible while the use of large bandgap III-N materials also provides a high BV such that sufficient RF output power may be generated for the wireless data transmission applications. This combination of high $F_t/F_{max}$ and high voltage capability also makes possible the use of the transistors described herein for high speed switching applications in DC-to-DC converters utilizing inductive elements of reduced size. As both the power amplification and DC-to-DC switching applications are key functional blocks in smart phones, tablets, and other mobile platforms, the structures described herein may be utilized in a SoC solution for such devices.

Figure 1A:
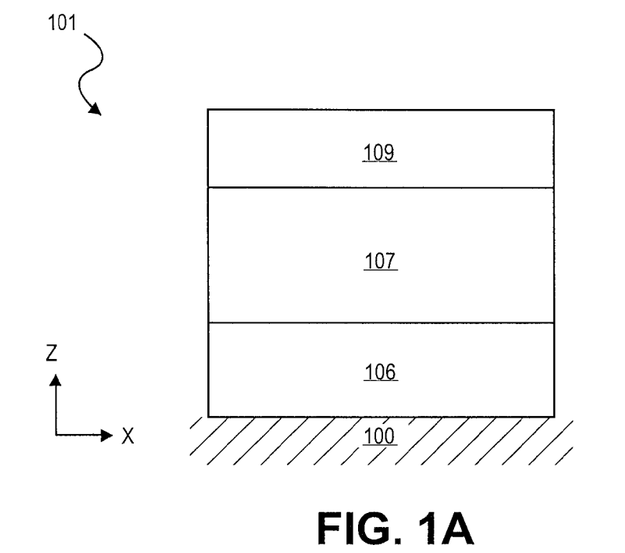
FIG. 1A illustrates a cross-section of a semiconductor stack in which a high electron mobility transistor may be formed, in accordance with embodiments.

FIG. 1A illustrates a cross-section of a III-N semiconductor stack 101 in which a high electron mobility transistor (HEMT) may be formed, in accordance with embodiments. At the base of the stack 101 is a substrate 100. Generally, the substrate 100 is a non-III-N material such that the stack 101 includes metamorphic epitaxial layers. In the exemplary embodiment, the substrate 100 is crystalline silicon (e.g., substantially monocrystalline). In first silicon substrate embodiments, the substrate 100 is (100) silicon (i.e., having a (100) top surface upon which overlying epitaxial layers are disposed). (100) crystal orientations are advantageous for the formation of silicon transistors (e.g., in other regions not covered by III-N epitaxial layers) and therefore is ideal for embodiments where a group III-N transistor formed in the stack 101 is to be monolithically integrated with silicon CMOS transistor technology. In a particular (100) silicon substrate embodiment, the substrate 100 has a vicinal surface, for example prepared by off-cutting the substrate from an ingot grown to provide wafer slices having (100) surfaces. The (100) substrate surface is offcut at an angle between 4° and 8° (e.g., 6°) towards the [110] direction to produce a surface having terraces that include a surface having a (100) crystal plane. The surface area of a (100) plane associated with each terrace depends on the specific offcut angle, with a greater angle producing a greater number of terraces with each terrace having lesser (100) surface area. In such embodiments, the offcut produces a vicinal surface having an array of (100) terraces, many of which are separated by a double atomic step with a height of two silicon atoms which can be useful in avoiding the formation of anti-phase domains (APD) within the stack 101. In second silicon substrate embodiments, the substrate 100 is (110) silicon. In certain (110) embodiments, the (110) substrate surface is offcut at an angle between 4° and 8° (e.g., 6°) to produce a surface having terraces that include a surface having a (110) crystal plane separated by a double atomic step with a height of two silicon atoms.

In third silicon substrate embodiments, the substrate 100 is (111) silicon (i.e., having a (111) top surface upon which overlying epitaxial layers are disposed). (111) crystal orientations are advantageous for III-N epitaxial growths because lattice mismatch is considerably less (approximately 16% while (100) silicon orientations have approximately 42% mismatch). Generally, for (111) silicon embodiments, no offcut need be provided. Although the exemplary (100), (110), and (111) silicon embodiments entail substrates consisting essentially of silicon (i.e., some trace level impurities not detrimental to III-N and/or silicon CMOS device function are permissible), it is noted that other substrates with similarly mismatched lattice constants may also benefit from the epitaxial stack architectures described herein, such as, but not limited to, substrates including germanium (Ge), which may be alloyed with silicon, or in a pure form.

In embodiments, an epitaxial semiconductor stack includes at least one III-N device layer. In the exemplary embodiment illustrated in FIG. 1A, the stack 101 may be referred to as a metamorphic epitaxial stack and is suitable for the formation of a HEMT, where at least the channel layer 107 and the top barrier layer 109 represent device layers. The channel layer 107 is substantially single crystalline and although is referred to herein as "monocrystalline," one of ordinary skill will appreciate that a low level of crystal defects may nevertheless be present as artifacts of an imperfect epitaxial growth processes. Within the channel layer 107, there is a crystalline arrangement of a first semiconductor material including one or more group III elements and nitrogen. Generally, the group III-nitride semiconductor in the channel layer 107 should have relatively high carrier mobility and therefore in embodiments, the channel layer 107 is substantially undoped group III-nitride material (i.e., impurity concentration minimized) for minimal impurity scattering. In the exemplary embodiment, the channel layer 107 is GaN. However, the channel layer 107 may also be one or more ternary alloy of GaN, such as AlGaN, AlInN, or a quaternary alloy of GaN including at least one group III element and nitrogen, such as $In_xAl_yGa_{1-x-y}N$.

In the exemplary GaN embodiment, the channel layer 107 is between 10 nm and 200 nm in thickness. With the buffer described further elsewhere herein, the GaN channel layer 107 may be in the upper end of the this thickness range, and beyond, without generation of defects as the thickness increases because the channel layer 107 is to be lattice matched to at least the buffer layer 106. The advantage of lattice matching the channel layer 107 with the buffer layer 106 is also relevant in other epitaxial stack embodiments suitable for a light emitting diode (LED) or laser integrated onto a silicon substrate, in which case a device layer may comprise many quantum well layers, p-type and n-type contact layers and one or more distributed Bragg structure, requiring significant total device layer thickness.

Disposed over the channel layer 107 is a cap or barrier layer (top barrier layer 109). Generally, any group III-N material may be utilized for the barrier layer 109, as dependent on the material selected for the channel layer 107 such that the barrier layer 109 has a larger bandgap than that of the channel layer 107. Preferably, top barrier layer 109 is substantially monocrystalline (i.e., having a thickness below the critical thickness for the given composition or lattice matched to the group III-N material utilized in the channel layer 107). In the exemplary embodiment, the barrier layer 109 includes a second group III-N material layer having the same crystallinity as that of the channel layer 107 to form a heterointerface. In a first exemplary embodiment where the channel layer 107 is GaN, the top barrier layer 109 is $Al_zGa_{1-z}N$, $Al_wIn_{1-w}N$, or AlN. One exemplary top barrier layer 109 has 18% In. In embodiments, the barrier layer 109 has only intrinsic impurity doping level (e.g., i-$Al_wIn_{1-w}N$). Quaternary alloys including at least one group III element and nitrogen, such as $In_xAl_yGa_{1-x-y}N$, are also possible. The barrier layer 109 may further comprise any multilayer stack of group III-nitrides, for example, an $Al_wIn_{1-w}N$/AlN stack with the AlN layer of the stack adjacent to channel layer 107 to serve as a mobility enhancing layer. Depending on the embodiment, the barrier layer 109 may range between 1 nm and 20 nm in thickness.

In embodiments, a metamorphic epitaxial semiconductor stack includes an aluminum indium nitride ternary alloy ($Al_xIn_{1-x}N$) buffer layer disposed between a non-group III-N substrate and the group III-N device layer(s). Generally, for an $Al_xIn_{1-x}N$ buffer layer(s), the mol. % is less than 100 (e.g., x<1), although the exact concentration may vary through different layers of the buffer. Although $Al_xIn_{1-x}N$ buffer layers present a number of advantages, of particular note is the relatively low epitaxial growth temperature of $Al_xIn_{1-x}N$. Whether the growth is by MBE or MOCVD, MOPVE, etc., the growth of $Al_xIn_{1-x}N$ is on the order of 300° C. lower than many alternative III-N materials. For example, while $Al_xIn_{1-x}N$ has a growth temperature generally between 750 and 800° C., AlGaN has a growth temperature of approximately 1050-1100° C. As such, the total thermal budget experienced during the growth of the stack 101 is advantageously reduced.

Also, the thermal expansion coefficient of $Al_xIn_{1-x}N$ buffer layers is more closely matched to that of silicon. Strain due to thermal mismatch is generally characterized as $\sigma = \Delta T \cdot (\varepsilon_{substrate} - \varepsilon_{epi\ layer})$, where $\Delta T$ denotes the difference between growth temperature and ambient room temperature and $\alpha$ denotes the thermal expansion coefficients of the substrate and epitaxial layer grown. The thermal expansion coefficient of $Al_xIn_{1-x}N$ is less than those of GaN(approximately $5.1 \times 10^{-6} K^{-1}$) or AlGaN ($>4 \times 10^{-6} K^{-1}$), decreasing as the indium fraction increases so that the net thermal mismatch between buffer layer(s) and the substrate 100 may be reduced significantly relative to non-$Al_xIn_{1-x}N$ alternatives. The presence of one or more $Al_xIn_{1-x}N$ buffer layers of substantial thickness reduces thermal stress exerted by a silicon substrate 100 on overlying III-N device layers having greater thermal mismatch, such as the exemplary GaN channel layer 107. Reductions in thermal stress have been found to reduce defect density in the device layer(s) and the surface crack formation in III-N epitaxial films deposited on Silicon In the exemplary embodiments where a buffer includes an $Al_xIn_{1-x}N$ layer, the mol fractions within the buffer are such that there is an $Al_xIn_{1-x}N$ layer lattice matched to an epitaxial device layer disposed over the buffer. The $Al_xIn_{1-x}N$ layer is therefore distinguished from a buffer layer that induces strain in the device layers due through pseudomorphic mechanisms (i.e., where a device layer strains to accommodate a non-native lattice constant). In the exemplary embodiment illustrated by FIG. 1A where the epitaxial stack 101 includes a GaN channel layer 107, the buffer includes an $Al_xIn_{1-x}N$ layer 106 with x between 0.80 and 0.84 with an In percentage of approximately 18% being substantially lattice matched to the GaN channel layer 107. As shown in FIG. 1A, the lattice matched $Al_xIn_{1-x}N$ layer 106 is disposed immediately below the channel layer 107. In embodiments, the lattice matched $Al_xIn_{1-x}N$ layer 106 has only intrinsic impurity doping level (e.g., i-$Al_xIn_{1-x}N$) and may be relatively thick to most effectively mitigate thermal stress exerted by a silicon substrate 100. Furthermore, with the lattice matched $Al_xIn_{1-x}N$ layer 106 having an approximate 42% lattice mismatch with an (100) silicon substrate 100, the layer 106 is to be thick enough to fully relax and glide resulting dislocations laterally (e.g., toward a topographical feature, etc.). In embodiments therefore, the lattice matched $Al_xIn_{1-x}N$ layer is between 50% and 99% of the total thickness of the buffer with particular embodiments of the $Al_xIn_{1-x}N$ layer 106 being between 300 nm and 2 μm and preferably at least 1 μm for most HEMT applications while greater thickness generally will offer lower defect densities, but incur additional expense/time of longer growths. As such, the $Al_xIn_{1-x}N$ layer 106 can be expected to be between 1.5 and 10 times greater for HEMT embodiments where a GaN channel layer 107 is between the 10 nm and 200 nm.

Figure 1B:
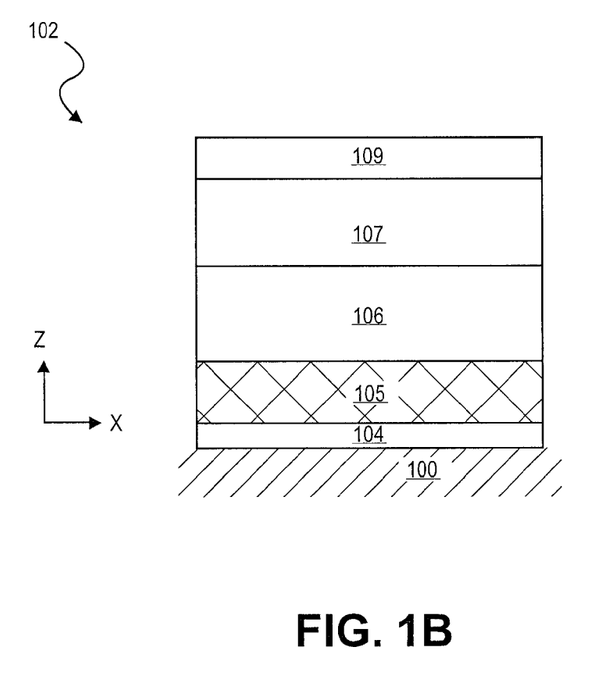
FIG. 1B illustrates a cross-section of a semiconductor stack in which a high electron mobility transistor may be formed, in accordance with embodiments.

FIG. 1B illustrates a cross-section of a semiconductor stack 102 in which an exemplary HEMT may also be formed, in accordance with embodiments. Generally, the stack 102 includes all the same epitaxial layers described for the stack 101 with like layers identified by same reference numbers. Similarly, the stack 102 is disposed on the same (growth) substrate 100 as previously described in the context of FIG. 1A. The stack 102 however further includes a nucleation layer 104 and a transition layer 105 disposed between the nucleation layer 104 and the lattice matched $Al_xIn_{1-x}N$ layer 106. Functionally, the nucleation layer is to initiate the epitaxial growth of the semiconductor materials comprising the stack 101 and while good results are possible for the stack 101 where the lattice matched $Al_xIn_{1-x}N$ layer 106 is formed directly on the substrate 100, addition of the nucleation layer may advantageously reduce APD occurrences, and/or further reduce defect density in the device layers (e.g., channel layer 107), and/or reduce total growth times, thermal budgets, etc. As the first III-N material layer of the stack 101, the nucleation layer 104 may be relatively thin, for example less than 100 nm (nanometers) in the z-dimension of FIG. 1B. Thickness of the nucleation layer 104 may be dependent, at least in part, on whether the substrate surface is offcut such that greater degrees of offcut are associated with greater thicknesses. Generally, the mobility of both the group III and group V species of the nucleation layer 104 are ideally sufficiently high that substantially random species motion can be effectively funneled in a direction dictated by the substrate terracing so as to avoid forming an APD in the polar epitaxial materials. In the exemplary embodiment, the nucleation layer 104 is aluminum nitride (AlN) grown to a thickness of between 50 nm and 100 nm. AlN embodiments have a lattice mismatch of approximately 43% to a (100) silicon plane.

As further illustrated in FIG. 1B, in addition to the lattice matched $Al_xIn_{1-x}N$ layer 106 the buffer further includes the transition layer 105 disposed over the nucleation layer 104. While it is possible for one or more intermediate layers to intervene between the transition layer 105 and nucleation layer 105; in the exemplary embodiment the transition layer 105 is disposed directly on, and in contact with, the nucleation layer and is in further direct contact with the $Al_xIn_{1-x}N$ layer 106. The transition layer 105 may be considered a lower buffer layer and is to function as a transition from the composition of the nucleation layer to the composition of the $Al_xIn_{1-x}N$ layer 106 disposed above the transition layer 105. Generally, the transition layer 105 is to be grown at a higher temperature than that used for the nucleation layer 104 (e.g., at the same temperature as the $Al_xIn_{1-x}N$ layer 106). Also, during the formation of the transition layer 105, the flux rate can be relatively higher than for the nucleation layer 104 (or for initial growths of the lattice matched $Al_xIn_{1-x}N$ layer 106 in embodiments where such a layer is grown directly on the substrate 100 as in FIG. 1A) because of the presence of the polar nucleation layer 104. For embodiments where the nucleation layer 104 is AlN, the transition layer 105 comprises an $Al_yIn_{1-y}N$ layer. Generally, the mol fraction y may be anything less than 1, and larger than x for the lattice matched $Al_xIn_{1-x}N$ layer 106. Therefore, in the exemplary embodiment where the channel layer 107 is GaN, and x is approximately 0.82 the lattice matched $Al_xIn_{1-x}N$ layer 106, y is greater than 0.82 within the transition layer 105. In further embodiments, the composition of the transition layer 105 is graded between the composition of the nucleation layer and the lattice matched layer 106. For example, in one such $Al_yIn_{1-y}N$ embodiment, y decreasing from approximately 1 nearest the nucleation layer toward approximately x nearest the lattice matched $Al_xIn_{1-x}N$ layer 106. The transition layer 105 is generally thinner than the $Al_xIn_{1-x}N$ layer 106, and may even be thinner than the nucleation layer 104. As one example, 50 nm should be sufficient to transition from an AlN nucleation layer 104 to an 18% In $Al_xIn_{1-x}N$ layer 106.

In further embodiments, a buffer between a III-N device layer and a non-III-N substrate includes a super lattice comprising a plurality of $Al_xIn_{1-x}N$ layers and group III-N layers. Notably, the $Al_xIn_{1-x}N$ in the super lattice need not be the 18% In $Al_xIn_{1-x}N$ layer 106, but may have other compositions. In one embodiment, for example, the super lattice comprises AlInN and AlN layers. In another embodiment, the group III-N device layer composition is lattice matched with the $Al_xIn_{1-x}N$ of the device layer, with a super lattice of the two readily formed with intervening $Al_xIn_{1-x}N$ layers still serving to mitigate thermal mismatch between the device layer and substrate.

Figure 2A:
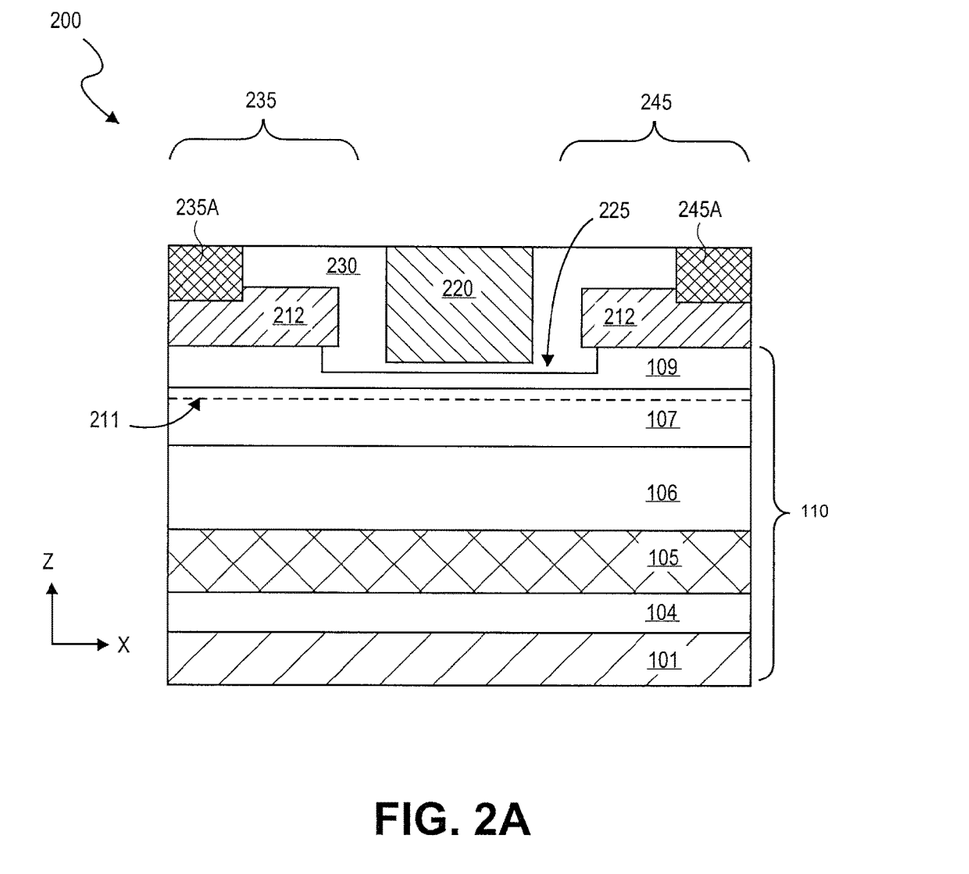
FIG. 2A illustrates a cross-section of a recessed gate group III-N transistor with epitaxially grown raised source/drain regions, in accordance with an embodiment.

FIG. 2A illustrates a cross-section of a recessed gate group transistor 200, in accordance with an embodiment. Generally, the transistor 200 is a majority carrier (electron), gate voltage controlled device (i.e., a FET). The transistor 200 is planar and disposed on the epitaxial semiconductor stack 102. In the exemplary embodiment, the transistor 200 has no junctions formed by impurity dopant gradients. As such, disadvantages associated with dopant diffusion, scattering, and breakdown voltage degradation are avoided. Disposed over the epitaxial semiconductor stack 102 are heavily impurity doped (e.g., N+) contact layers 212.

In the illustrative embodiment, a proper thickness of the top barrier layer 109, or a separate material disposed between the top barrier layer 109 and the channel layer 107 serves as a charge inducing layer to controllably supply carriers by inducing a sheet of charge, commonly referred to as a 2-D electron gas (e.g., 2DEG 211 in FIG. 2A). While embodiments may utilize the top barrier layer 109 as the only source of sheet charge, in other embodiments the presence of the compositionally distinct charge inducing layer enables a thinning of the top barrier layer 109 for threshold voltage tuning while ensuring a thin (e.g., >0.5 nm) wideband gap material is at the surface of the channel layer 107 for reduced alloy scattering and high carrier mobility.

As a result of different polarizations of the materials utilized in the channel layer 107 and the top barrier layer 109 (or intervening charge inducing layer), a density of charge may be provided which can further be modulated through selection of a work function metal as the gate electrode 220 and/or control of the semiconductor thickness along the gate length (x-dimension). As such, performance characteristics of the transistor 200 depend on the materials chosen for the top barrier layer 109, the gate electrode 220 along the longitudinal transistor length disposed between the gate electrode 220 and the channel layer 107, demarked as the recessed gate region 225. In the exemplary embodiment, where the channel layer 107 is GaN and the top barrier layer 109 is at least one of $Al_zGa_{1-z}N$, $Al_wIn_{1-w}N$, or AlN (e.g., with AlN being a charge inducing layer materially distinct from another material serving as part of the top barrier layer 109).

In embodiments, the transistor 200 is operable in enhancement mode. Enhancement mode operation, where the transistor 200 has a threshold voltage ($V_t$) greater than 0V, is important for power efficient switching in a PMIC, and efficient shut-down of a power amplifier in an RFIC during idle, for example. In an embodiment, the gate electrode 220 includes a large work function metal to increase the $V_t$. A work function metal which may be selected to obtain a desired threshold voltage ($V_t$) (e.g., greater than 0V, etc) with exemplary conductive gate materials include, tungsten (W), aluminum (Al), titanium (Ti), tantalum(Ta), nickel (Ni), molybdenum (Mo), germanium (Ge), platinum (Pt), gold (Au), ruthenium (Ru), palladium (Pd), iridium (Ir), their alloys and silicides, carbides, nitrides, phosphides, and carbonitrides thereof.

The transistor 200 is a single recessed gate architecture with the top barrier layer 109 having only one recessed gate region 225. As such, the top barrier layer 109 has a first thickness between the gate electrode 220 and channel layer 107 a second thickness between the source or drain semiconductor 212 and the channel layer 107. Thinning of the top barrier layer 109 helps achieve enhancement mode because the spontaneous and piezoelectric polarization induced charges in the channel layer disposed below the gate electrode 220 can be depleted, increasing $V_t$. Depending on the embodiment, the first thickness may be 0%-50% of the second thickness (e.g., ranging from 0-2.5 nm). For embodiments without a work function gate metal, the top barrier layer 109 may need to be completely etched away to obtain a $V_t>0V$. Where a separate charge inducing layer is present, the recessed gate region 225 may have a top barrier thickness of 0%, to expose the charge inducing layer so it is the only source for carriers within the recess. In the exemplary embodiment where the channel layer 107 is undoped, a work function metal gate electrode and gate recess are employed to provide for enhancement mode operation.

In addition to being advantageous for low defect density device layers, the lattice matched $Al_xIn_{1-x}N$ layer further functions as a more efficient back barrier to confine the 2DEG with the channel layer 107 because of the materials relatively greater polarization, relative to alternatives, such as AlGaN, thereby improving short channel performance of the device considerably over alternative device stacks lacking the lattice matched $Al_xIn_{1-x}N$ buffer layer. More specifically, subthreshold slope and drain induced barrier lowering (DIBL) is reduced for the lattice matched $Al_xIn_{1-x}N$ back barrier relative to AlGaN. Indeed, for an exemplary HEMT channel length ($L_g$) of 20 nm having symmetrical source and drain ($L_{GD}=L_{GS}=40$ nm), a 5V $V_{DS}$ and $-2V$ $V_{GS}$ is expected to have a drain current of $1e^{-5}$ A/mm for an AlInN barrier while it AlGaN would be three orders of magnitude greater.

Figure 2B:
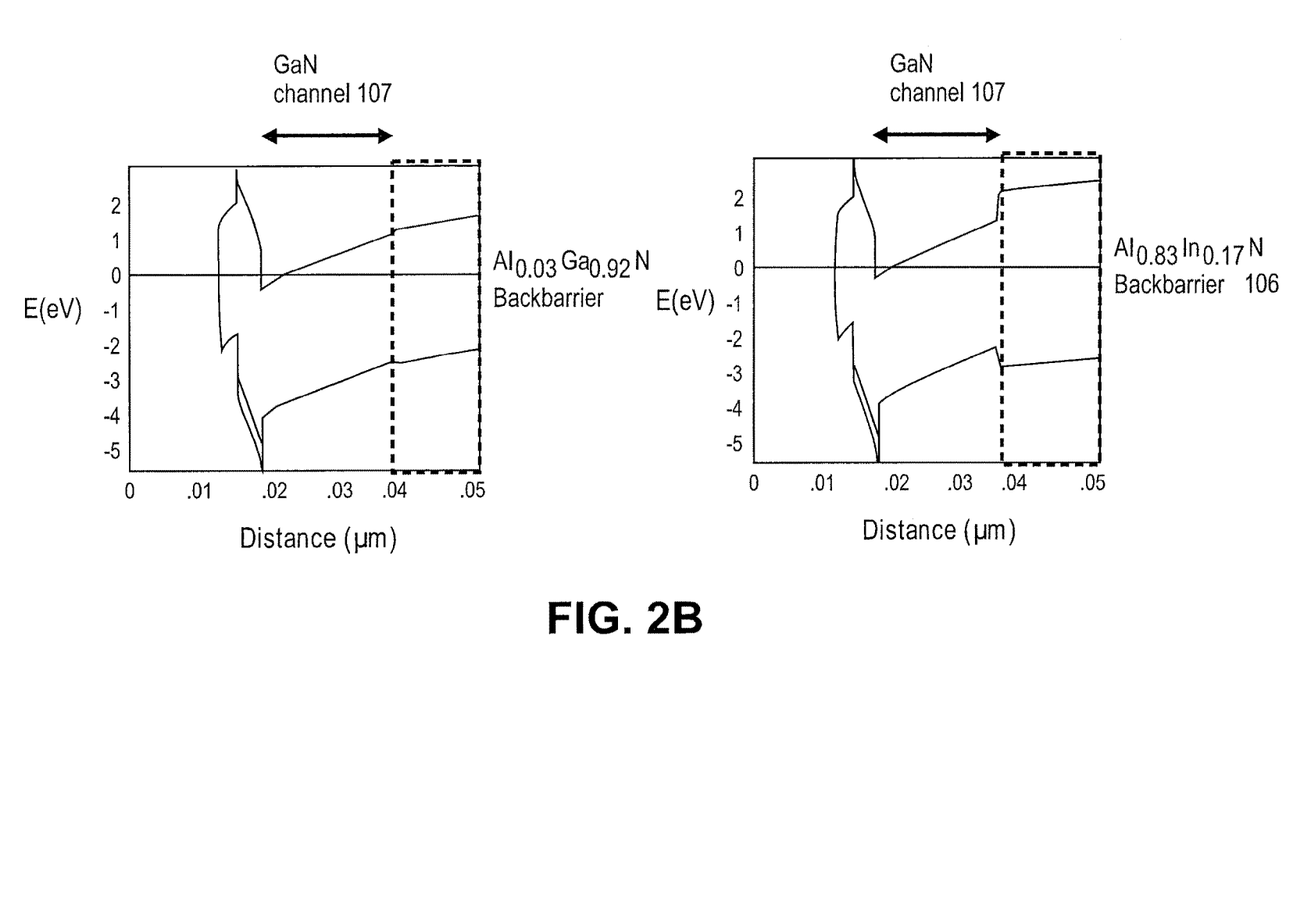
FIG. 2B illustrates band diagrams for regions of the transistor comparing bottom barriers of $Al_yGa_{1-y}N$ to those of $Al_xIn_{1-x}N$, in accordance with embodiments of the present invention.

FIG. 2B illustrates band diagrams for regions of the transistor 200 comparing bottom barriers of $Al_yGa_{1-y}N$ (where y is 0.08-0.10) to those of a lattice matched $Al_xIn_{1-x}N$, in accordance with embodiments of the present invention. As shown in the region highlighted by the dashed box, the large bandgap of $Al_xIn_{1-x}N$ (approximately 4.9 eV) renders it a relatively more insulating buffer layer and reducing parallel conduction beneath the channel layer 107 which is particularly advantageous for high voltage devices. Of further note, if a metamorphic $Al_xIn_{1-x}N$ buffer layer is absent, (e.g. where an AlGaN buffer is utilized under a GaN channel layer), incorporation of a $Al_xIn_{1-x}N$ bottom barrier, if similarly lattice matched to GaN would further reduce the allowable thickness of the GaN channel layer as the cumulative thickness of such a bottom barrier and channel layer would be limited to a given critical thickness.

Returning to FIG. 2A, disposed on either side of the gate electrode 220 is a source 235 and drain 245 that includes impurity doped (e.g., N+) semiconductor regions 212 electrically coupled to an ohmic contact metal 235A, 245A. The impurity doped semiconductor regions 212 may be any low bandgap group III-N material, such as InGaN and InN, for formation of low resistance contacts, or simply n-type GaN.

Disposed between the top barrier layer 109 and the gate electrode 220 is a dielectric layer 230. The dielectric layer 230 electrically insulates the gate electrode 220 from the semiconductor stack 102 and may also isolate the gate electrode 220 from source and drain 235, 245. In the embodiment illustrated in FIG. 2A, the dielectric layer 230 serves as both a gate dielectric and a spacer dielectric, laterally separating the gate electrode 220 from the source and drain 235, 245. In the exemplary embodiment, the dielectric layer 230 is a self-aligned spacer structure enabling self-aligned, ultra-scaling of the source-to-drain spacing down to <100 nm to reduce the extrinsic resistance ($R_{ext}$) of the transistor, lead to higher transconductance ($G_m$) or gain, and hence higher $F_t$. Dielectric spacers also enable scaling of the transistor channel length ($L_g$) to dimensions smaller than lithographically definable feature sizes. Dielectrics materials such silicon nitrides ($Si_xN$), silicon oxide ($SiO_2$), alumina ($Al_2O_3$) and high-k dielectrics such as $Gd_2O_3$, $HfO_2$, high-K silicates such as HfOSiO, TaSiO, AlSiO, and high-K oxynitrides such as HfON, SiON, AlON, ZrSiON, HfSiON, and group III-ON are suitable for the dielectric layer 230. In embodiments, the dielectric layer 230 serves to passivate the interface between gate electrode 220 and top surface of the stack 102 to preserve high channel mobility and reduce gate leakage current. High quality passivation is achieved in one embodiment with an atomic layer deposited (ALD) dielectric layer 230.

Although not depicted, other HEMT embodiments include a double recessed gate group III-N transistor includes the same semiconductor stack 102, gate electrode 220, and source and drains 235, 245 as described for the transistor 200. However, instead of the single recess 225 illustrated in FIG. 2A, a double recessed HEMT embodiment includes the recess 225 and a second recessed region so that the top barrier layer 109 has three thicknesses, a first between the channel layer 107 and the source and drain 235, 245, a second thickness between the channel layer 107 and the dielectric layer 230 (under the gate electrode 220), and a third thickness between the channel layer 107 and a spacer dielectric laterally separating the gate electrode 220 from source and drain 235, 245. The third thickness is generally intermediate of the first and the second thicknesses. Relative to the transistor 200, a double-recessed embodiment has an advantage of preserving the 2DEG charge density under the spacer dielectric when the region disposed under the gate electrode 220 is depleted, thereby preserving low access resistance to the channel region under the gate electrode 220.

While the transistor 200 is a planar device, in other embodiments, a non-planar group III-N transistor is formed in the stack 101 or 102. Although not depicted, for non-planar transistor embodiments at least one of the semiconductor layers of an epitaxial semiconductor stack (e.g., 101 or 102) a non-planar semiconductor body having opposite sidewalls over which a gate dielectric layer, a gate electrode, and/or a non-planar source, drain is wrapped. A non-planar transistor may include all the functional features described for the exemplary planar transistor 200 with the materials and thicknesses of the semiconductor stack 101 or 102 being as previously described. Depending on the crystal orientation of the group III-nitride stacks 101, 102, the 2DEG may be proximate to a top surface or a sidewall of a non-planar semiconductor body. As the GaN and other group III-nitrides described herein form the wurtzite structure which is notable in that it is non-centrosymmetric meaning that the crystal lacks inversion symmetry, and more particularly the {0001} planes are not equivalent, in one non-planar embodiment, the wurtzite crystal orientation is such that the (0001) plane forms a top surface of the crystal and interfaces the lattice matched layer 106. For such an embodiment top barrier layer 109 and the $Al_xIn_{1-x}N$ layer 106 function as charge inducing layer and a back barrier, respectively.

In alternate non-planar HEMT embodiments, where the channel layer 107 is formed into a non-planar body, the overlying semiconductor layers of the epitaxial semiconductor stack 101 or 102 may then be grown on the top and sidewall surfaces. For such an embodiment the crystal orientation may either be as above or such that the (100) plane forms a top surface of the crystal and interfaces with the lattice matched $Al_xIn_{1-x}N$ layer 106. For such an embodiment, a barrier layer formed on sidewalls of the non-planar channel layer 107 cause the spontaneous polarization field, $P_{SP}$ within a non-planar body to be directed away from a first sidewall toward a second sidewall. As such, the polarization of the non-planar group III-N transistor may be through a width or through a thickness of a non-planar semiconductor body of a non-planar HEMT embodiment.

Figure 3:
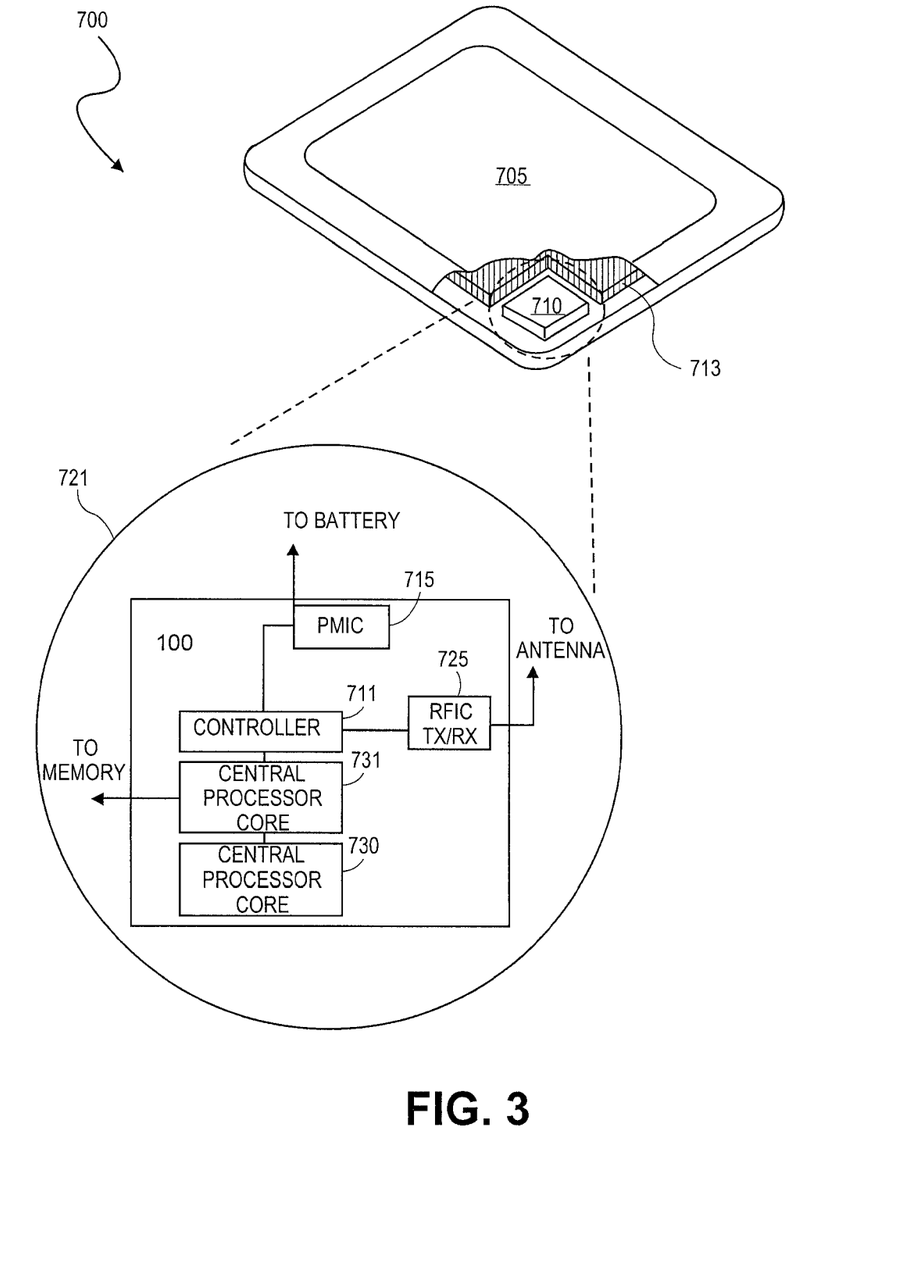
FIG. 3 is a functional block diagram of a group III-N SoC implementation of a mobile computing platform, in accordance with an embodiment of the present invention.

FIG. 3 is a functional block diagram of a SoC implementation of a mobile computing platform, in accordance with an embodiment of the present invention. The mobile computing platform 700 may be any portable device configured for each of electronic data display, electronic data processing, and wireless electronic data transmission. For example, mobile computing platform 700 may be any of a tablet, a smart phone, laptop computer, etc. and includes a display screen 705 that is in the exemplary embodiment a touch-screen (e.g., capacitive, inductive, resistive, etc.) permitting the receipt of user input, the SoC 710, and a battery 713. As illustrated, the greater the level of integration of the SoC 710, the more of the form factor within the mobile computing platform 700 that may be occupied by the battery 713 for longest operative lifetimes between charging, or occupied by memory (not depicted), such as a solid state drive, for greatest functionality.

Depending on its applications, mobile computing platform 700 may include other components including, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The SoC 710 is further illustrated in the expanded view 721. Depending on the embodiment, the SoC 710 includes a portion of a substrate 100 (i.e., a chip) upon which two or more of a power management integrated circuit (PMIC) 715, RF integrated circuit (RFIC) 725 including an RF transmitter and/or receiver, a controller thereof 711, and one or more central processor core 730, 731 is fabricated. The RFIC 725 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The RFIC 725 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As will be appreciated by one of skill in the art, of these functionally distinct circuit modules, CMOS transistors are typically employed exclusively except in the PMIC 715 and RFIC 725. In embodiments of the present invention, the PMIC 715 and RFIC 725 employ one or more of the group III-nitride transistors as described herein (e.g., group III-nitride transistor 200) utilizing an embodiment of the epitaxial stacks described herein (e.g., stack 101 or 102). In further embodiments the PMIC 715 and RFIC 725 employing the group III-nitride transistors described herein are integrated with one or more of the controller 711 and processor cores 730, 731 provided in silicon CMOS technology monolithically integrated with the PMIC 715 and/or RFIC 725 onto the (silicon) substrate 100. It will be appreciated that within the PMIC 715 and/or RFIC 725, the high voltage, high frequency capable group III-nitride transistors described herein need not be utilized in exclusion to CMOS, but rather silicon CMOS may be further included in each of the PMIC 715 and RFIC 725.

The group III-nitride transistors described herein may be specifically utilized where a high voltage swings present (e.g., 7-10V battery power regulation, DC-to-DC conversion, etc. within the PMIC 715). As illustrated, in the exemplary embodiment the PMIC 715 has an input coupled to the battery 713 and has an output provide a current supply to all the other functional modules in the SoC 710. In a further embodiment, where additional ICs are provided within the mobile computing platform 700 but off the SoC 710, the PMIC 715 output further provides a current supply to all these additional ICs off the SoC 710. With the reduced ON resistance available (e.g., through the symmetric $L_{gd}/L_{gs}$) and low access resistance (e.g., 2DEG 211 present in spacer region within channel layer 107), particular embodiments of the group III-nitride transistors described herein permit the PMIC to operate at higher frequencies (e.g., 50× those possible in LDMOS implementations). In certain such embodiments, inductive elements within the PMIC (e.g., buck-boost convertors, etc.) may be scaled to much smaller dimensions. As such inductive elements in the PMIC account for 60-70% of chip area, embodiments of the PMIC implemented in the group III-nitride transistors described herein offer a significant shrink over other PMIC architectures.

As further illustrated, in the exemplary embodiment the PMIC 715 has an output coupled to an antenna and may further have an input coupled to a communication module on the SoC 710, such as an RF analog and digital baseband module (not depicted). Alternatively, such communication modules may be provided on an IC off-chip from the SoC 710 and coupled into the SoC 710 for transmission. Depending on the group III-nitride materials utilized, the group III-nitride transistors described herein (e.g., transistor 200) may further provide the large power added efficiency (PAE) needed from a power amplifier transistor having an $F_t$ of at least ten times carrier frequency (e.g., a 1.9 GHz in an RFIC 725 designed for 3G or GSM cellular communication).

Figure 4:
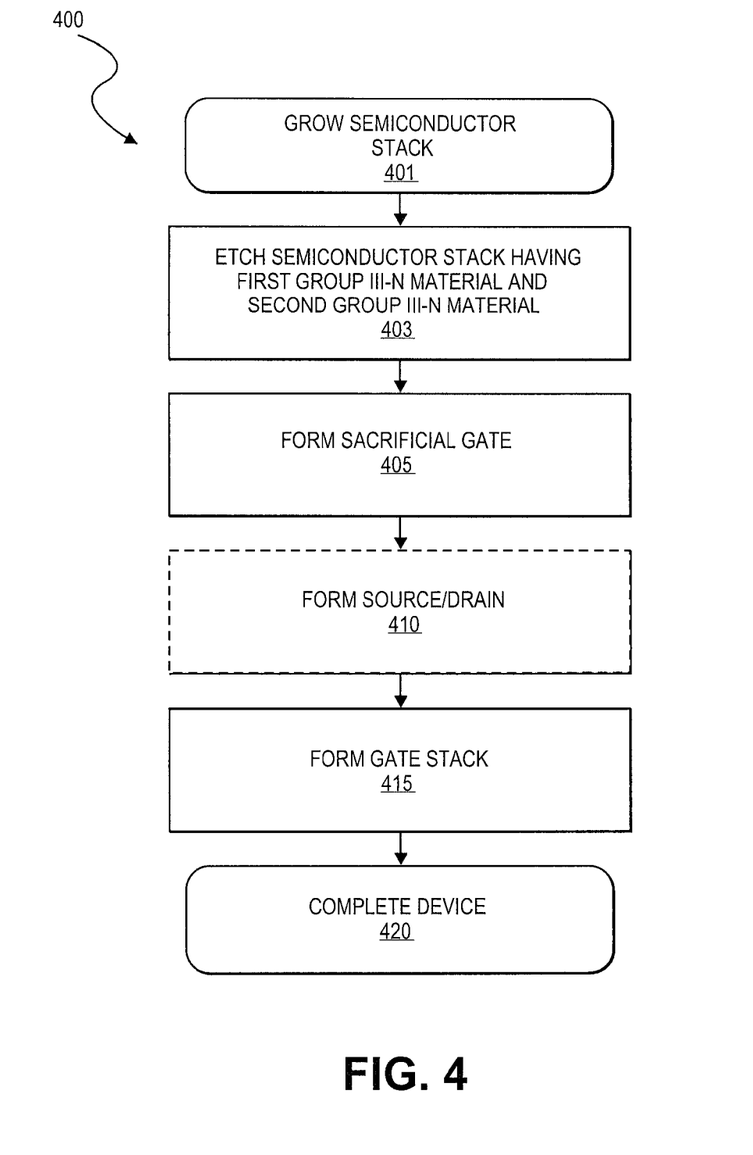
FIG. 4 is a flow diagram illustrating a method of fabricating a non-planar high voltage transistor, in accordance with embodiments.

FIG. 4 is a flow diagram illustrating a method 400 of fabricating the high voltage group III-nitride transistors described herein, in accordance with embodiments. While method 400 highlights certain operations, each of these operations may entail many more process sequences.

Beginning at operation 401, a stack of monocrystalline semiconductor materials is grown using any standard metal organic chemical vapor deposition (MOCVD), molecular beam epitaxy (MBE), metal organic vapor phase epitaxy (MOVPE) growth tools/techniques, or the like, with standard precursors, temperatures, etc. for a given film. In one embodiment, the entire semiconductor stack 101 or 102 (FIGS. 1A, 1B) is grown using such techniques. For example, to form the stack 102, an AlN nucleation layer 104 is grown on a (100) surface of a silicon substrate. Next, growth temperature is changed to 750-800° C. and In is introduced, for example at increasing amounts relative to Al to form a graded $Al_yIn_{1-y}N$ transition layer 105 until reaching an approximate 18% In composition, at which point the lattice matched $Al_xIn_{1-x}N$ layer 106 is grown for example to the thickness range described elsewhere herein. Growth temperature is then ramped up from the $Al_xIn_{1-x}N$ growth temperature by approximately 300° C., for example to 1050° C. and precursors, etc. changed appropriately for growth of the channel layer 107, for example GaN. Remaining at the higher temperature, a top barrier layer 109 of $Al_zGa_{1-z}N$ is formed, and/or the growth temperature reduced to form an AlN or $Al_wIn_{1-w}N$ layer. In one embodiment, an in-situ n-type impurity doped source/drain layer may then be grown as a higher level device layer, or in an alternate embodiment, (e.g., as illustrated by operation 410 in FIG. 4, which is dashed as being optional), a regrowth process is performed subsequently in the fabrication process to form source/drain regions.

At operation 403, at least a portion of the epitaxial semiconductor stack 110 is etched with any plasma or wet chemical etch techniques known in the art for the particular materials epitaxially grown as part of the semiconductor stack 101 or 102. Referring further to FIG. 2A, in certain embodiments operation 403 entails etching at least a portion of the top barrier layer 109 to form the recessed region 225. For embodiments where the semiconductor stack 101 includes a source/drain layer(s) disposed over the top barrier layer 109, the source/drain layer(s) are etched during operation 403. For embodiments where the source/drain is later formed by regrowth, the etch process at operation 403 merely entails etching a portion of the top barrier layer 109. For a non-planar transistor embodiment (not depicted), the epitaxial stack (e.g., 101 or 102) is etched into a semiconductor fin structure at operation 403.

Proceeding with operation 405, a sacrificial gate is formed in the recessed region. A gate replacement process permits an epitaxial regrowth of source drain regions (if desired), enables formation of a gate electrode to be formed last with a work function metal (if desired), and enables double recessed gate architectures, etc. In exemplary embodiment, a sacrificial gate includes a CVD polysilicon, or silicon nitride/oxynitride, etc. The sacrificial gate may be laterally separated from the surrounding film (e.g., field dielectric, etched layers of epitaxial stack) by a spacer structure. In certain embodiments, with the sacrificial gate and spacer structure serving as a mandrel protecting the channel region of the device stack, at operation 410 source and drain regions (e.g., 212 in FIG. 2A) are regrown, for example on the top barrier layer 109. In one embodiment a compositionally graded ternary alloy of GaN is epitaxially grown one the epitaxial stack not protected by the sacrificial gate. In alternate embodiments of the method 400 in FIG. 4 where the epitaxial stack includes source/drain regions, operation 410 is omitted.

At operation 415 the sacrificial gate (stack) is removed to exposed the epitaxial stack (e.g., 101 or 102). For a double recessed gate embodiment, the top barrier layer 109 is etched a second time to form a second recessed region that is narrower than the recess 225. In certain single recess embodiments, in operation 415 entails etching at least a portion of the top barrier layer 109 a first time to form the recess 225 after removal of the sacrificial gate structure rather than before sacrificial gate formation. With the device layers of the epitaxial stack prepared, a gate dielectric layer is formed in the first or second recessed region. In embodiments, the gate dielectric layer is formed by depositing any of the dielectric materials described for dielectric layer 230 (e.g., a high-K dielectric material) using an ALD technique known to be suitable for the particular dielectric material. A work function metal (e.g., any of those described in the context of the transistor 200) is then deposited on the gate dielectric layer, and planarized to from the gate electrode 220. The device is then completed at operation 420, for example using conventional techniques to form ohmic contacts 235A, 245A and interconnect metallization (not depicted in FIG. 2A).

In further embodiments where CMOS transistors are also formed in the silicon substrate 100, one or more of the operations in method 400 may be concurrently or selectively performed (e.g., using conventional masking techniques) to silicon CMOS regions and HEMT regions of the substrate.

Embodiments of a semiconductor material stack have therefore been described. Aa semiconductor material stack, including a silicon substrate; a group III-N device layer disposed over the silicon substrate; and a buffer disposed between the silicon substrate and the group III-N device layer, wherein the buffer includes an $Al_xIn_{1-x}N$ layer, with x being less than unity. In further embodiments, the $Al_xIn_{1-x}N$ layer is lattice matched to the group III-N device layer and is in direct contact with the group device layer. In further embodiments, the group device layer is GaN, and the top barrier comprises at least one of $Al_zGa_{1-z}N$, $Al_wIn_{1-w}N$, or AlN, and wherein x is between 0.80 and 0.84, and wherein the silicon substrate has a (100), (110), or (111) crystal orientation. In further embodiments, the silicon substrate has (100) orientation and is offcut to between 4° and 8° toward the [110] direction. In further embodiments, the $Al_xIn_{1-x}N$ layer has a thickness that is between 1.5 and 10 times greater than the group device layer. In further embodiments, the buffer includes a super lattice comprising a plurality of $Al_xIn_{1-x}N$ layers and group layers. In further embodiments, the buffer further comprises an AlN nucleation layer disposed between the $Al_xIn_1,N$ layer and the silicon substrate. In further embodiments, the buffer further comprises an $Al_yIn_{1-y}N$ transition layer disposed between the AlN nucleation layer and the $Al_xIn_{1-x}N$ layer, wherein y>x. In further embodiments, y is graded with decreasing from approximately 1 nearest the nucleation layer toward approximately x nearest the $Al_xIn_{1-x}N$ layer. In further embodiments, the $Al_xIn_{1-x}N$ layer comprises between 50% and 99% of the total thickness of the buffer.

In embodiments, a high electron mobility transistor (HEMT), includes: a gate electrode disposed between a source contact and a drain contact; a gate dielectric disposed below the gate electrode; a group III-N channel layer disposed below the gate dielectric; a bottom barrier disposed below the channel layer, wherein the bottom barrier comprises $Al_xIn_{1-x}N$ layer lattice matching the channel layer; and a silicon substrate disposed below the bottom barrier with the $Al_xIn_{1-x}N$ layer disposed over a (100) or (111) crystal plane of the substrate. In further embodiments, the HEMT includes a top barrier layer having a first thickness between the gate electrode and the channel layer and a second, greater thickness, between the source contact and drain contact disposed on either side of the gate electrode, wherein the top barrier layer comprises at least one of $Al_zGa_{1-z}N$, $Al_wIn_{1-w}N$, or AlN. In further embodiments, the group III-N channel layer comprises a GaN layer having a thickness between 10 nm and 200 nm, wherein the $Al_xIn_{1-x}N$ layer has a thickness that is between 400 nm and 2 μm, and wherein x is between 0.80 and 0.84; an AlN nucleation layer is disposed between the $Al_xIn_{1-x}N$ layer and the silicon substrate; and the $Al_xIn_{1-x}N$ layer is disposed on an $Al_yIn_{1-y}N$ transition layer disposed over the AlN nucleation layer and the wherein y is graded from approximately 1 nearest the nucleation layer toward approximately x nearest the $Al_xIn_{1-x}N$ layer. In further embodiments, the channel layer is undoped within a region disposed below a gate electrode and the first thickness of the top barrier layer induces charge to form a two dimensional electron gas (2DEG) within the channel layer only when the gate electrode is at a threshold voltage ($V_t$) greater than 0V.

In embodiments, a mobile computing device, includes a touchscreen; a battery; an antenna; a DC-to-DC converter coupled to the battery; and a wireless transmitter further including a power amplifier (PA), wherein at least one of the DC-to-DC converter and the PA comprises the HEMT as described herein. In embodiments, the DC-to-DC converter comprises a first HEMT as described herein, and the PA employs a second HEMT, as described herein.

In embodiments, a method of forming a high electron mobility transistor, the method includes forming a sacrificial gate structure over a stack of semiconductor material layers disposed on crystalline silicon substrate, the stack comprising a group III-N semiconductor channel layer disposed on a lattice matched $Al_xIn_{1-x}N$ layer that has a thickness greater than the channel layer; forming a source and a drain region on opposite sides of the sacrificial gate structure; removing the sacrificial gate structure to expose a surface of the epitaxially grown stack; forming a gate dielectric layer on the exposed surface of the epitaxially grown stack with an atomic layer deposition process; and forming a gate electrode on the gate dielectric layer.

In embodiments, the method further comprises forming the stack of semiconductor material layers by: epitaxially growing a graded $Al_yIn_{1-y}N$ transition layer over an AlN nucleation layer disposed on the substrate; epitaxially growing the $Al_xIn_{1-x}N$ layer over the $Al_yIn_{1-y}N$ transition layer, wherein y is graded from approximately 1 nearest the nucleation layer toward approximately x nearest the $Al_xIn_{1-x}N$ layer; and epitaxially growing the group III-N semiconductor channel consisting essentially of GaN over the $Al_xIn_{1-x}N$ layer; and epitaxially growing a top barrier layer comprising a ternary group III-nitride over the channel layer.

In embodiments, the graded $Al_yIn_{1-y}N$ transition layer is grown directly on the AlN nucleation layer to a thickness between 50 nm and 100 nm, wherein the $Al_xIn_{1-x}N$ layer is grown directly on the $Al_yIn_{1-y}N$ transition layer to a thickness between 300 nm and 2 μm, and wherein the channel layer is grown directly on the $Al_xIn_{1-x}N$ layer to a thickness between 10 nm and 200 nm.

In embodiments, the stack of semiconductor material layers is disposed on a (100) surface of the substrate offcut to between 4° and 8° toward the [110] direction; and wherein the ternary group III-nitrides is selected from the group consisting of: $Al_xGa_{1-x}N$, $Al_wIn_{1-w}N$, and $In_zGa_{1-z}N$.

It is to be understood that the above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A semiconductor material stack, comprising:
   a silicon substrate having a first lattice constant;
   a group III-N device layer disposed over the silicon substrate, the group III-N device layer having a second lattice constant different than the first lattice constant;
   a buffer disposed between the silicon substrate and the group III-N device layer, wherein the buffer includes an $Al_xIn_{1-x}N$ layer, with x being less than unity; a top barrier layer formed above the group III-N device layer;
   N-type group III-N source and drain regions disposed on the top barrier layer;
   a gate electrode disposed between the N-type group III-N source and drain regions, wherein the top barrier layer has a first thickness between the gate electrode and the group III-N device layer and a second, greater, thickness between the N-type group III-N source and drain regions and the group III-N device layer, and
   a third thickness between a spacer region disposed between the gate electrode and each of the group III-N source and drain regions and the group III-N device layer, wherein the third thickness is intermediate to the first thickness and the second thickness and a gate dielectric disposed below the gate electrode and adjacent to sidewalls of the gate electrode.

2. The semiconductor material stack of claim 1, wherein the top barrier layer comprises a multilayer stack comprising an $Al_wIn_{1-w}N$/AlN stack with the AlN layer of the stack adjacent to the group III-N device layer.

3. The semiconductor material stack of claim 1, wherein the $Al_xIn_{1-x}N$ layer has a top surface which is latticed matched and in direct contact with the group III-N device layer.

4. The semiconductor material stack of claim 3, wherein the buffer includes a $Al_yIn_{1-y}N$ transition layer between the silicon substrate and the $Al_xIn_{1-x}N$ layer, and wherein the $Al_yIn_{1-y}N$ transition layer is graded between the silicon substrate and the group III-N device layer wherein y decreases from the silicon substrate toward the group III-N device layer.

5. The semiconductor material stack of claim 1, further comprising: a pair of ohmic contacts disposed on the N-type group source and drain regions, wherein an uppermost surface of the pair of ohmic contacts is co-planar or substantially co-planar with an uppermost surface of the gate electrode and with an uppermost surface of the gate dielectric.

6. The material stack of claim 1, wherein x is between 0.80 and 0.84, and wherein the silicon substrate has a (100), (110), or (111) crystal orientation.

7. The material stack of claim 6, wherein the silicon substrate has (100) orientation and is offcut to between 4° and 8° toward the [110] direction.

8. The material stack of claim 1, wherein the $Al_xIn_{1-x}N$ layer has a thickness that is between 1.5 and 10 times greater than the group device layer.

9. The material stack of claim 1, wherein the buffer includes a super lattice comprising a plurality of $Al_xIn_{1-x}N$ layers and group layers.

10. The material stack of claim 1, wherein the buffer further comprises an AlN nucleation layer disposed between the $Al_xIn_{1-x}N$ layer and the silicon substrate.

11. The material stack of claim 1, wherein the $Al_xIn_{1-x}N$ layer comprises between 50% and 99% of the total thickness of the buffer.

12. A high electron mobility transistor (HEMT), comprising:
   a gate electrode disposed between a source contact and a drain contact;
   a gate dielectric disposed below the gate electrode and adjacent to sidewalls of the gate electrode, wherein an uppermost surface of the gate dielectric is co-planar or substantially co-planar with an uppermost surface of the gate electrode, with an uppermost surface of the source contact, and with an uppermost surface of the drain contact;
   a group III-N channel layer having a first lattice constant disposed below the gate dielectric; a top barrier layer formed above the group III-N channel layer, wherein the gate electrode is electrically isolated from the top barrier layer by the gate dielectric layer;

N-type group III-N source and drain regions disposed on the top barrier layer and coupled to the source contact and drain contact, respectively, wherein the top barrier layer has a first thickness between the gate electrode and the group III-N channel layer and a second, greater, thickness between the N-type group III-N source and drain regions and the group III-N device layer, and a third thickness between a spacer region disposed between the gate electrode and each of the group III-N source and drain regions and the group III-N channel layer, wherein the third thickness is intermediate to the first thickness and the second thickness;

a bottom barrier disposed below the channel layer, wherein the bottom barrier comprises $Al_xIn_{1-x}N$ layer having a top surface lattice matching the channel layer and a $Al_yIn_{1-y}N$ transition layer disposed below the $Al_xIn_{1-x}N$ layer; and a silicon substrate having a second lattice constant different than the first lattice constant disposed below the bottom barrier with the $Al_xIn_{1-x}N$ layer disposed over a (100) or (111) crystal plane of the substrate and wherein the $Al_yIn_{1-y}N$ layer is graded between the silicon substrate and the group III-N channel layer wherein y decreases from the silicon substrate toward the group III-N channel layer.

13. The HEMT of claim 12, wherein the group III-N channel layer comprises a GaN layer having a thickness between 10 nm and 200 nm, wherein the $Al_xIn_{1-x}N$ layer has a thickness that is between 400 nm and 2 km, and wherein x is between 0.80 and 0.84, the HEMT further comprising:

an AlN nucleation layer is disposed between the $Al_yIn_{1-y}N$ transition layer and the silicon substrate.

14. The HEMT of claim 12, wherein the channel layer is undoped within a region disposed below a gate electrode and the first thickness of the top barrier layer induces charge to form a two dimensional electron gas (2DEG) within the channel layer only when the gate electrode is at a threshold voltage ($V_t$) greater than 0V.

15. A method of fabricating a semiconductor material stack, the method comprising:

forming a buffer over a silicon substrate, wherein the silicon substrate has a first lattice constant, and wherein the buffer includes an $Al_xIn_{1-x}N$ layer, with x being less than unity;

forming a group III-N device layer over the buffer, the group III-N device layer having a second lattice constant different than the first lattice constant;

forming a top barrier layer above the group III-N device layer; forming N-type group III-N source and drain regions on the top barrier layer; and forming a gate electrode between the N-type group III-N source and drain regions, wherein the top barrier layer has a first thickness between the gate electrode and the group III-N device layer and a second, greater, thickness between the N-type group source and drain regions and the group III-N device layer, and a third thickness between a spacer region disposed between the gate electrode and each of the group III-N source and drain regions and the group III-N device layer, wherein the third thickness is intermediate to the first thickness and the second thickness.

16. The method of claim 15, further comprising:
forming a gate dielectric below the gate electrode and adjacent to sidewalls of the gate electrode.

17. The method of claim 15, wherein the top barrier layer comprises a multilayer stack comprising an $Al_wIn_{1-w}N$/AlN stack with the AlN layer of the stack adjacent to the group III-N device layer.

18. The method of claim 15, wherein the $Al_xIn_{1-x}N$ layer has a top surface which is latticed matched and in direct contact with the group III-N device layer.

19. The method of claim 18, wherein the buffer includes a $Al_yIn_{1-y}N$ transition layer between the silicon substrate and the $Al_xIn_{1-x}N$ layer, and wherein the $Al_yIn_{1-y}N$ transition layer is graded between the silicon substrate and the group III-N device layer wherein y decreases from the silicon substrate toward the group device layer.

20. The method of claim 15, further comprising:
forming a pair of ohmic contacts disposed on the N-type group III-N source and drain regions, wherein an uppermost surface of the pair of ohmic contacts is co-planar or substantially co-planar with an uppermost surface of the gate electrode and with an uppermost surface of the gate dielectric.

21. The method of claim 15, wherein x is between 0.80 and 0.84, and wherein the silicon substrate has a (100), (110), or (111) crystal orientation.

22. The method of claim 21, wherein the silicon substrate has (100) orientation and is offcut to between 4° and 8° toward the [110] direction.

23. The method of claim 15, wherein the $Al_xIn_{1-x}N$ layer has a thickness that is between 1.5 and 10 times greater than the group III-N device layer.

24. The method of claim 15, wherein the buffer includes a super lattice comprising a plurality of $Al_xIn_{1-x}N$ layers and group III-N layers.

25. The method of claim 15, wherein the buffer further comprises an AlN nucleation layer disposed between the $Al_xIn_{1-x}N$ layer and the silicon substrate.

26. The method of claim 15, wherein the $Al_xIn_{1-x}N$ layer comprises between 50% and 99% of the total thickness of the buffer.

27. A method of forming a high electron mobility transistor, the method comprising:

forming a stack of semiconductor material layers disposed on a crystalline silicon substrate, the stack comprising a group III-N semiconductor channel layer disposed on a lattice matched $Al_xIn_{1-x}N$ layer that has a thickness greater than the channel layer;

recessing a portion of the stack of semiconductor material layers;

forming a sacrificial gate structure over the recessed portion of the stack of semiconductor material layers;

forming a source and a drain region on opposite sides of the sacrificial gate structure;

removing the sacrificial gate structure to expose a surface of the epitaxially grown stack;

forming a gate dielectric layer on the exposed surface of the epitaxially grown stack with an atomic layer deposition process; and forming a gate electrode on the gate dielectric layer.

28. The method of claim 27, wherein the method further comprises forming the stack of semiconductor material layers by:

epitaxially growing a graded $Al_yIn_{1-y}N$ transition layer over an AlN nucleation layer disposed on the substrate;

epitaxially growing the $Al_xIn_{1-x}N$ layer over the $Al_yIn_{1-y}N$ transition layer, wherein y is graded from approximately 1 nearest the nucleation layer toward approximately x nearest the $Al_xIn_{1-x}N$ layer; and epitaxially growing the group III-N semiconductor channel consisting essentially of GaN over the $Al_xIn_{1-x}N$ layer; and epitaxially growing a top barrier layer comprising a ternary group III-nitride over the channel layer.

29. The method of claim 28, wherein the graded $Al_yIn_{1-y}N$ transition layer is grown directly on the AlN nucleation layer to a thickness between 50 nm and 100 nm, wherein the $Al_xIn_{1-x}N$ layer is grown directly on the $Al_yIn_{1-y}N$ transition layer to a thickness between 300 nm and 2 μm, and wherein the channel layer is grown directly on the $Al_xIn_{1-x}N$ layer to a thickness between 10 nm and 200 nm.

30. The method of claim 29, wherein the stack of semiconductor material layers is disposed on a (100) surface of the substrate offcut to between 4° and 8° toward the direction; and wherein the ternary group III-nitrides is selected from the group consisting of: $Al_xGa_{1-x}N$, $Al_wIn_{1-w}N$, and $In_zGa_{1-z}N$.

* * * * *